United States Patent
Chang

(10) Patent No.: US 8,216,941 B2
(45) Date of Patent: Jul. 10, 2012

(54) METHOD FOR MANUFACTURING PHASE CHANGE MEMORY DEVICE

(75) Inventor: Heon Yong Chang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 967 days.

(21) Appl. No.: 12/211,418

(22) Filed: Sep. 16, 2008

(65) Prior Publication Data

US 2009/0269928 A1  Oct. 29, 2009

(30) Foreign Application Priority Data

Apr. 29, 2008 (KR) .................. 10-2008-0039947

(51) Int. Cl.
 *H01L 21/302* (2006.01)

(52) U.S. Cl. .......... 438/692; 438/689; 438/690; 356/63; 356/148

(58) Field of Classification Search ............. 438/689, 438/690, 692; 356/63, 148, 163
See application file for complete search history.

(56) References Cited

U.S. PATENT DOCUMENTS

| | | | |
|---|---|---|---|
| 7,405,965 B2 * | 7/2008 | Choi et al. | 365/163 |
| 7,541,252 B2 * | 6/2009 | Eun et al. | 438/381 |
| 7,723,716 B2 * | 5/2010 | Choi | 257/4 |
| 2007/0057308 A1 * | 3/2007 | Min et al. | 257/314 |
| 2009/0039333 A1 * | 2/2009 | Chang et al. | 257/4 |

FOREIGN PATENT DOCUMENTS

KR  10-0625170 B1  9/2006

* cited by examiner

*Primary Examiner* — Nadine G Norton
*Assistant Examiner* — Maki Angadi
(74) *Attorney, Agent, or Firm* — Ladas & Parry LLP

(57) ABSTRACT

A method for manufacturing a phase change memory device that prevents or minimizes adverse performance characteristics associated with inadequate overlap between top electrode contacts and top electrodes. The method prevents or minimizes unwanted chemical changes and etch losses of the phase change material when building the top electrode. The method includes forming spacers on sidewalls of remaining portions of the insulation layer and the hard masks so that subsequent etching of the conductive layer and the phase change material layer uses the spacers and the hard masks as an etch mask to form top electrodes and a phase change layer. Accordingly, the method promises to provide a way of achieving a high level of integration for the resultant phase change memory devices.

14 Claims, 11 Drawing Sheets

METHOD FOR MANUFACTURING PHASE CHANGE MEMORY DEVICE

CROSS-REFERENCE TO RELATED APPLICATIONS

The present application claims priority to Korean patent application number 10-2008-0039947 filed on Apr. 27, 2008, which is incorporated herein by reference in its entirety.

BACKGROUND OF THE INVENTION

The present invention relates generally to a method for manufacturing a phase change memory device, and more particularly to a method for manufacturing a phase change memory device that can form stable top electrode contacts.

Memory devices are largely divided into a volatile RAM (random access memory) sub-category that loses inputted information when power is interrupted and into a non-volatile ROM (read-only memory) sub-category that can continuously maintain the stored state of inputted information even when power is interrupted. As to well-known representative volatile RAMs, DRAMs (dynamic RAM) and SRAMs (static RAM) can be mentioned. As to well known representative non-volatile ROMs, a flash memory device such as the EEPROM (electrically erasable and programmable ROM) can be mentioned.

As is well known in the art, DRAMs are excellent memory devices but DRAMs require high charge storing capacity. Since the surface area of an electrode must be increased to achieve a high charge storing capacity, it is difficult to achieve a high level of integration in a DRAM. Further, difficulties are experienced in the flash memory devices because of the fact that flash memory devices often require that two gates are stacked upon each other. Therefore, flash memory devices require high operation voltages when compared to the power source voltage demands of volatile RAMs. Yet further, flash memory devices often times require separate booster circuits to supply the necessary voltage required for write and delete operations. Accordingly, it is difficult to achieve a high level of integration for flash memory devices.

Under these circumstances, it is not surprising that considerable amounts of research have been devoted towards actively developing alternate novel memory devices. Preferably these alternate novel memory devices should have simple configurations and should be capable of accomplishing a high level of integration while retaining many of the desirable characteristics of the non-volatile memory devices. As an example of an alternate novel memory device would be a phase change memory device which has recently been disclosed in the art.

In phase change memory devices, a phase change can occur in a phase change layer interposed between a bottom electrode and a top electrode from a crystalline state to an amorphous state when subjected to an electrical current flowing between the bottom electrode and the top electrode. Information stored in phase change memory cells is recognized by using a measurable difference in resistance between the crystalline state and the amorphous state. Because the specific resistance of the phase change layer in the amorphous state is higher than the specific resistance of the phase change layer in the crystalline state, then sensing the current flowing through the phase change layer can be used to "read" the contents in each cell. Accordingly, one can arbitrarily assign a logic value of '1' or '0' to correspond to the information stored in a phase change cell depending on the state of the phase.

In fabricating phase change memory devices, bit lines and their respective phase change cells have to be electrically connected with each other. After patterning the phase change layer and top electrodes to constitute the phase change cells, contacts (hereinafter referred to as "top electrode contacts") are formed on the top electrodes. The bit lines are then formed to connect with the top electrode contacts.

However, although not illustrated and described in detail, in the conventional art, the overlap between the top electrode contacts and the top electrodes is not large. If the overlap even slightly deviates away from forming the top electrode contacts, the phase change layer zones, which underlies the top electrodes, are likely to be inadvertently etched, and as a result the top electrode contacts can directly contact the phase change layer. As a result of this slight misalignment and inadvertent etching of the phase change layer, the composition of a Chalcogenide compound forming the phase change layer can be partially chemically changed as well as etch loss of the phase change layer can occur. Accordingly, as a result of this scenario of slight misalignment and inadvertent etching of the phase change layer, the electrical performance characteristics of the phase change layer may become non-uniform.

To address some of the problems brought about by non-uniformization of the performance characteristics of the phase change layer resulting from composition changes and the etch losses, the top electrode contacts can be patterned to be much more larger so as to increase the overlap between the top electrode contacts and the top electrodes. However, in this case, as the size of the cells increases in the direction of word lines, the area of an entire semiconductor chip increases, whereby defeating the goal of achieving a high integration of the phase change memory device. Alternately, if the top electrode contacts are patterned on the top electrodes to have a decreased size, then the contact resistance between the top electrodes and the bit lines increases, and as a result the current flow from the bit lines to switching elements may change, or non-uniform contacts may be formed so that the bit lines are electrically open relative to the top electrodes.

SUMMARY OF THE INVENTION

Embodiments of the present invention are directed to a method for manufacturing a phase change memory device which can prevent or at least minimize the characteristics of a phase change layer from becoming non-uniform due to composition changes and etch losses of the phase change layer that can arise from inadequate overlap when forming top electrode contacts.

In one aspect of the present invention, a method for manufacturing a phase change memory device comprises the steps of forming a phase change material layer and a conductive layer on a semiconductor substrate; forming an insulation layer having contact holes on the conductive layer; forming top electrode contacts in the contact holes; forming hard masks to cover the top electrode contacts and portions of the insulation layer which adjoin the top electrode contacts; etching portions of the insulation layer which are exposed from the hard masks; forming spacers on both sidewalls of remaining portions of the insulation layer and the hard masks; and etching the conductive layer and the phase change material layer using the spacers and the hard masks as an etch mask and thereby forming top electrodes and phase change layer zones underneath the top electrode.

Before the step of forming the phase change material layer and the conductive layer, the method further comprises the steps of forming switching elements on the semiconductor substrate; and forming bottom electrodes to contact the switching elements.

The switching elements are formed as vertical PN diodes.

Before the step of forming the switching elements, the method further comprises the step of forming impurity regions in a surface of the semiconductor substrate.

The bottom electrodes are formed as any one of TiAlN, TiW, TiN, WN and admixtures thereof.

The conductive layer comprises any one of TiAlN, TiW, TiN, WN and admixtures thereof.

The step of forming the top electrode contacts comprises the steps of depositing a conductive layer for top electrode contacts on the insulation layer including the contact holes; and removing the conductive layer for top electrode contacts until the insulation layer is exposed.

The step of removing the conductive layer for top electrode contacts is conducted through either an etch-back or a CMP process.

The step of etching the portions of the insulation layer which are exposed from the hard masks is implemented such that the insulation layer remains on sidewalls of the top electrode contacts.

The insulation layer, the conductive layer and the phase change material layer are preferably etched substantially along a linear alignment.

After the step of forming the top electrodes and the phase change layer, the method further comprises the step of forming a protective layer along a profile of the phase change layer, the top electrodes, the hard masks and the spacers.

After the step of forming the top electrodes and the phase change layer, the method further comprises the step of removing the hard masks from the top electrode contacts.

After the step of removing the hard masks, the method further comprises the step of forming bit lines on the top electrode contacts to contact the top electrode contacts.

After the step of forming the bit lines, the method further comprises the step of forming word lines over the bit lines to contact the semiconductor substrate.

DESCRIPTION OF SPECIFIC EMBODIMENT

Hereafter, the specific embodiment of the present invention will be described in detail with reference to the accompanying drawings.

Figure 1:
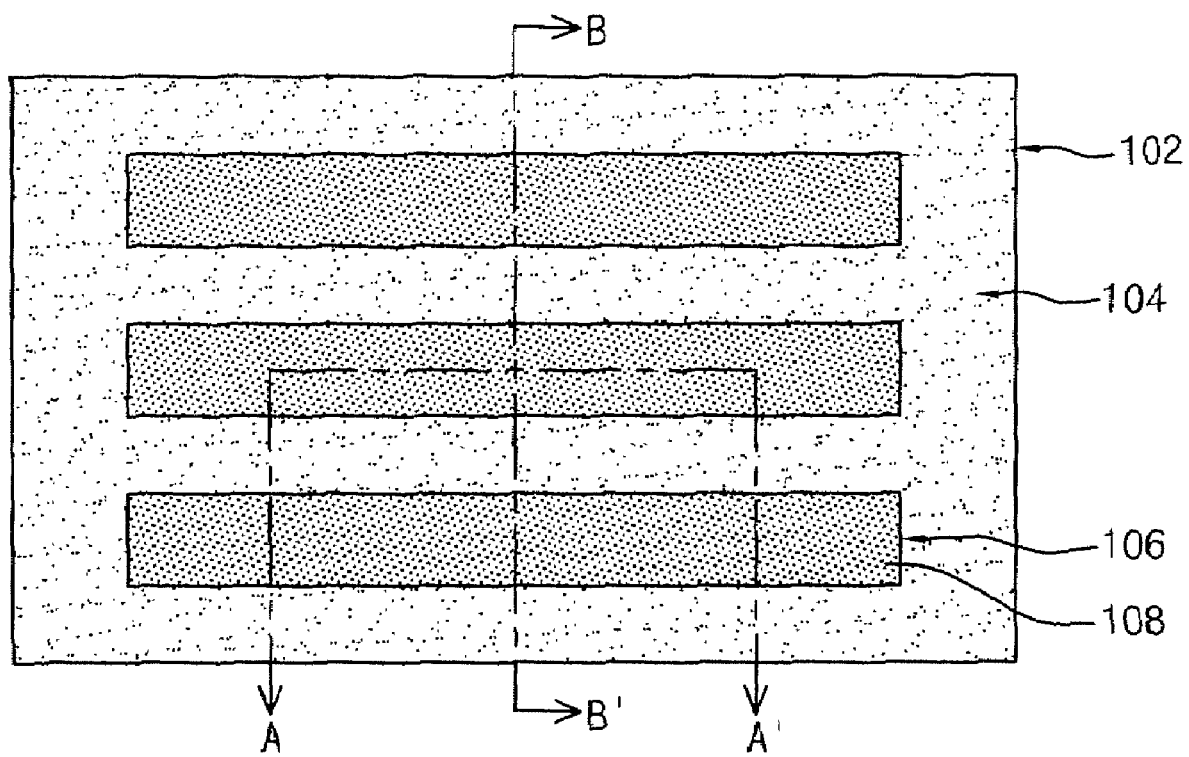
FIG. 1 is a top plan view used to explain a method for manufacturing a phase change memory device in accordance with an embodiment of the present invention.

FIG. 1 is a top plan view used to explain a method for manufacturing a phase change memory device in accordance with an embodiment of the present invention. FIGS. 2A through 2J are cross sectional side views, taken along the line A-A' of FIG. 1, illustrating some of the processes of the method for manufacturing a phase change memory device in accordance with the embodiment of the present invention. FIGS. 3A through 3J are cross sectional side views, taken along the line B-B' of FIG. 1, illustrating some of the processes of the method for manufacturing a phase change memory device in accordance with the embodiment of the present invention.

Figure 2A:
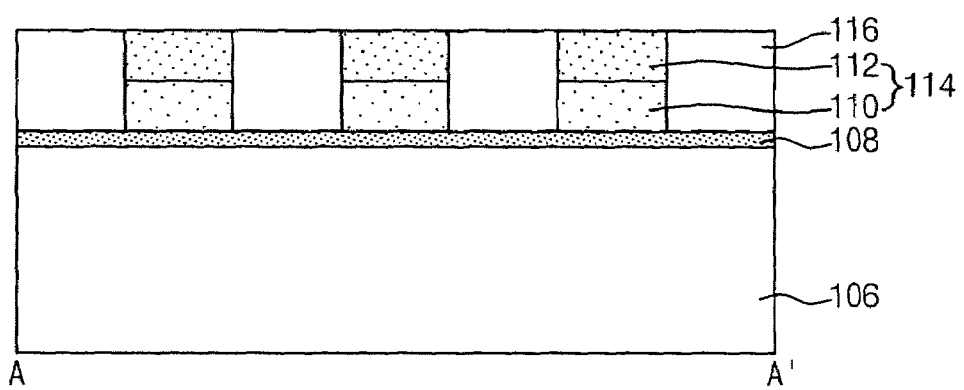
FIGS. 2A through 2J are cross sectional side views taken along the line A-A' of FIG. 1, illustrating the processes of the method for manufacturing a phase change memory device in accordance with the embodiment of the present invention.
Figure 3A:
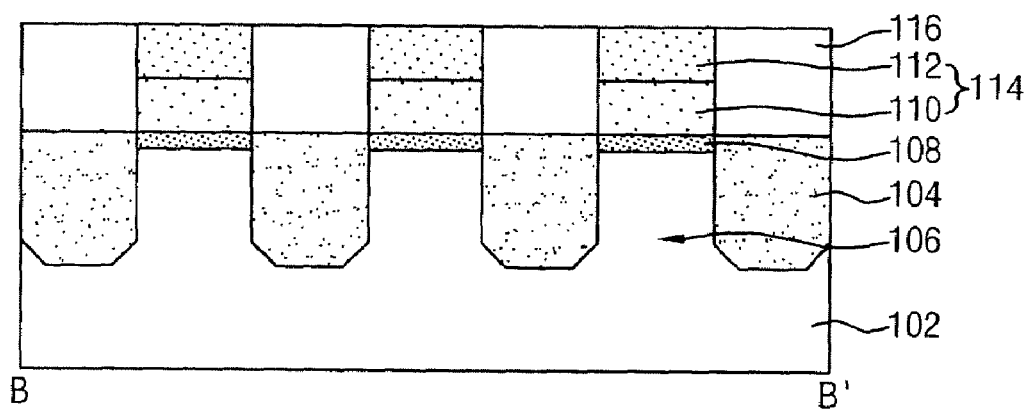
FIGS. 3A through 3J are cross sectional side views taken along the line B-B' of FIG. 1, illustrating the processes of the method for manufacturing a phase change memory device in accordance with the embodiment of the present invention.

Referring to FIGS. 2A and 3A, an isolation structure 104 is formed in a semiconductor substrate 102 to delimit active regions 106. By implanting $N^+$ impurities in the surfaces of the active regions 106 on the semiconductor substrate 102, impurity regions 108 are formed. After forming a first insulation layer 116 on the 20 semiconductor substrate 102, which is formed with the impurity regions 108, first holes are defined by etching the first insulation layer 116, and switching elements 114 are formed in the first holes. The switching elements 114 are formed as vertical PN diodes that include an N-type area 110 and a P-type area 112.

Figure 2B:
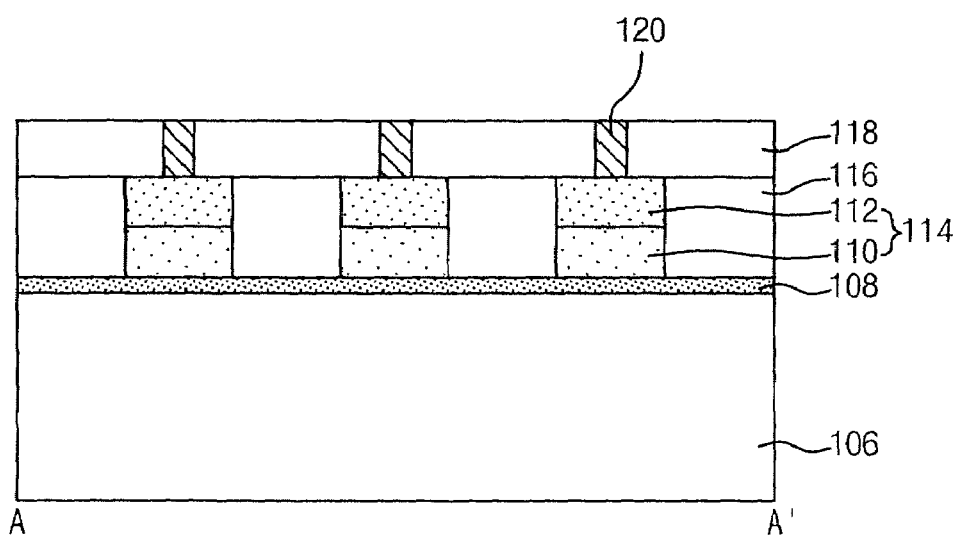
Figure 3B:
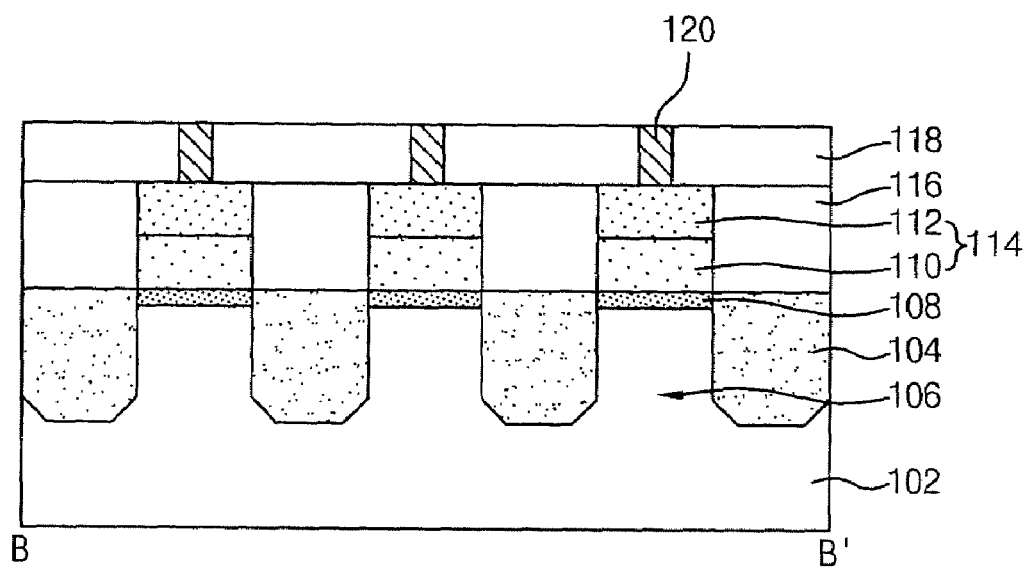

Referring to FIGS. 2B and 3B, a second insulation layer 118 is formed on the first insulation layer 116 including the switching elements 114. By differentially etching selected portions of the second insulation layer 118, second holes are defined that expose the switching elements 114. By using any one of TiAlN, TiW, TiN, WN and admixtures thereof, which have high electric and heat conductivity, to fill in the second holes, bottom electrodes 120 are formed that contact the switching elements 114.

Figure 2C:
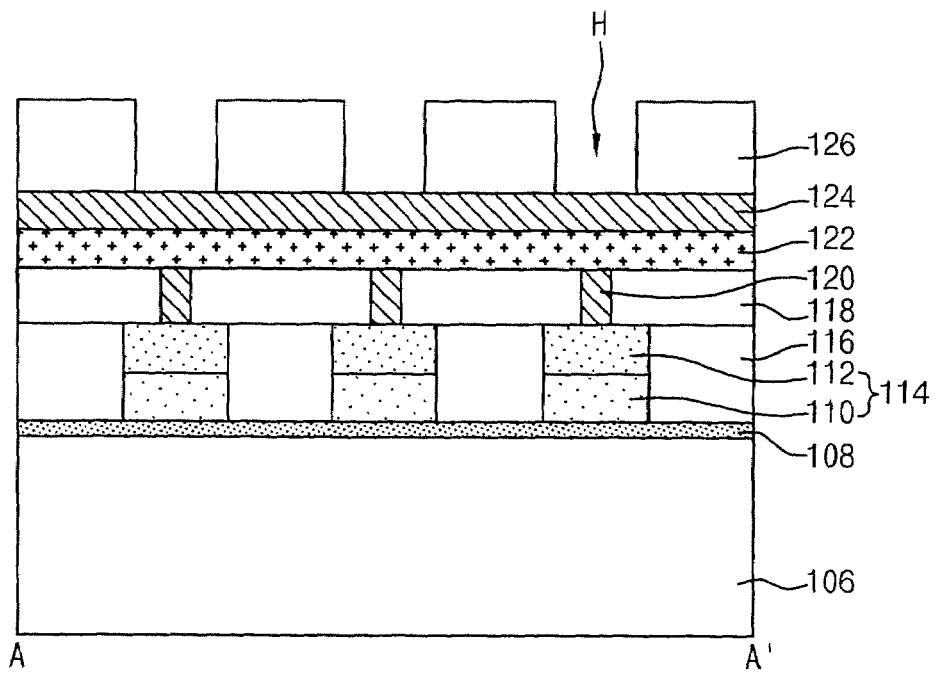
Figure 3C:
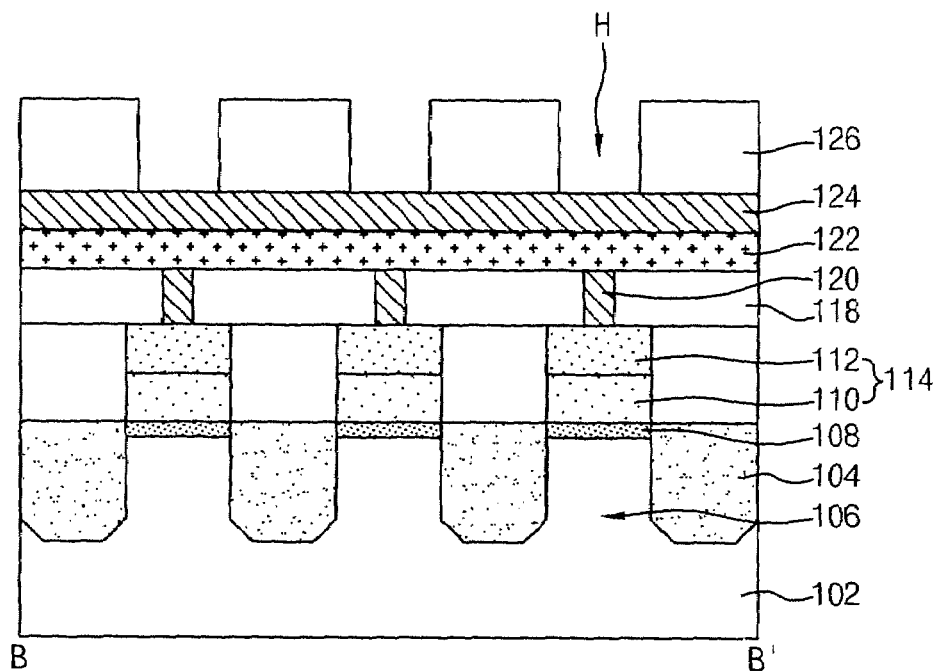

Referring to FIGS. 2C and 3C, a phase change material layer 122 and a first conductive layer 124 for top electrodes (not shown) are sequentially formed on the second insulation layer 118 including the bottom electrodes 120. The phase change material layer 122 is formed of a material containing at least one of Ge (germanium), Sb (stibium) and Te (tellurium). The first conductive layer 124 for top electrodes (not shown) is formed as any one of TiAlN, TiW, TiN, WN and admixtures thereof. A third insulation layer 126 is formed on the first conductive layer 124 for top electrodes (not shown) and by differentially etching selected portions of the third insulation layer 126, third holes H for top electrode contacts are defined.

Here, when forming the phase change material layer 122, impurities of at least one of oxygen, nitrogen and silicon can be implanted into the phase change material layer 122 so that the grain growth properties of the phase change material layer 122 can be restrained or controlled.

Figure 2D:
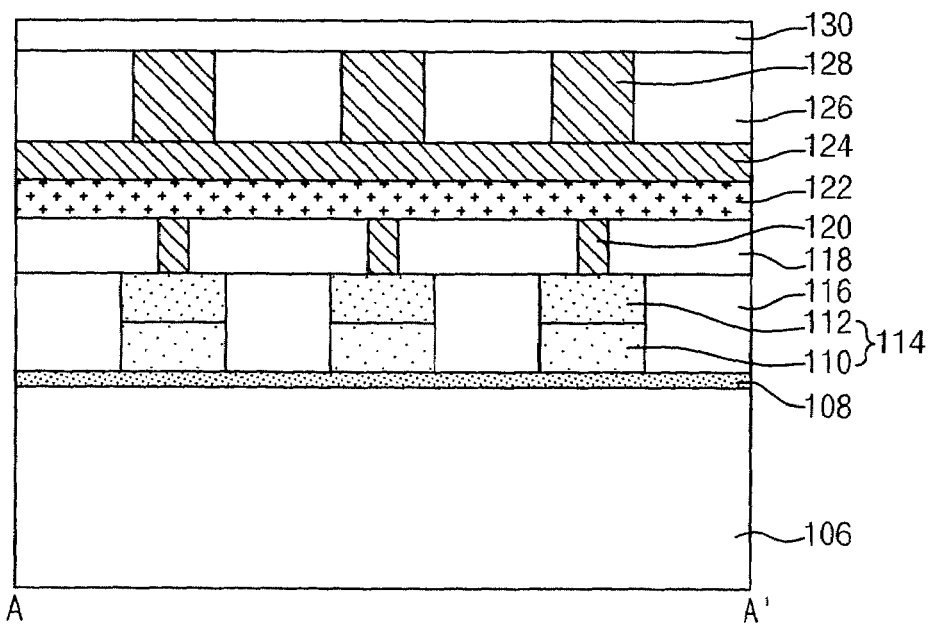
Figure 3D:
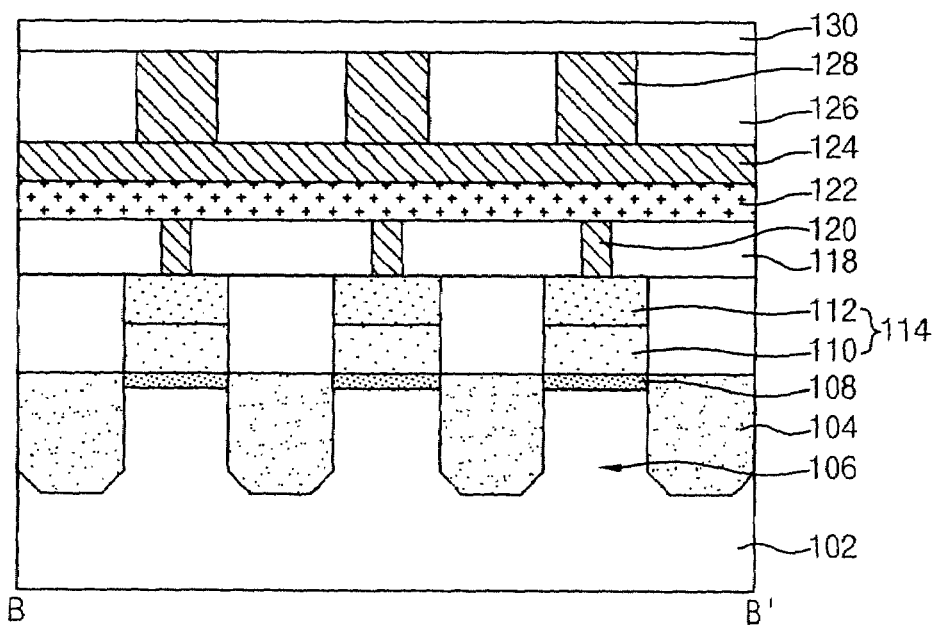

Referring to FIGS. 2D and 3D, a second conductive layer (not shown) for top electrode contacts 128 is formed on the third insulation layer 126 to fill the third holes H for top electrode contacts. Next, by removing the second conductive layer (not shown) for top electrode contacts 128, which is formed on the third insulation layer 126, through an etch-back or CMP (chemical mechanical polishing) process, top electrode contacts 128 are defined in the third holes H. A hard mask layer 130 is then formed on the third insulation layer 126 including the top electrode contacts 128. The hard mask layer 130 is formed to prevent the loss of the top electrode contact 128 during subsequently etching of the first conductive layer 124 for top electrodes and the phase change material layer 122 and to allow a subsequently formed fourth insulation layer (not shown) to be appropriately polished up to the upper ends of the top electrode contacts 128.

Figure 2E:
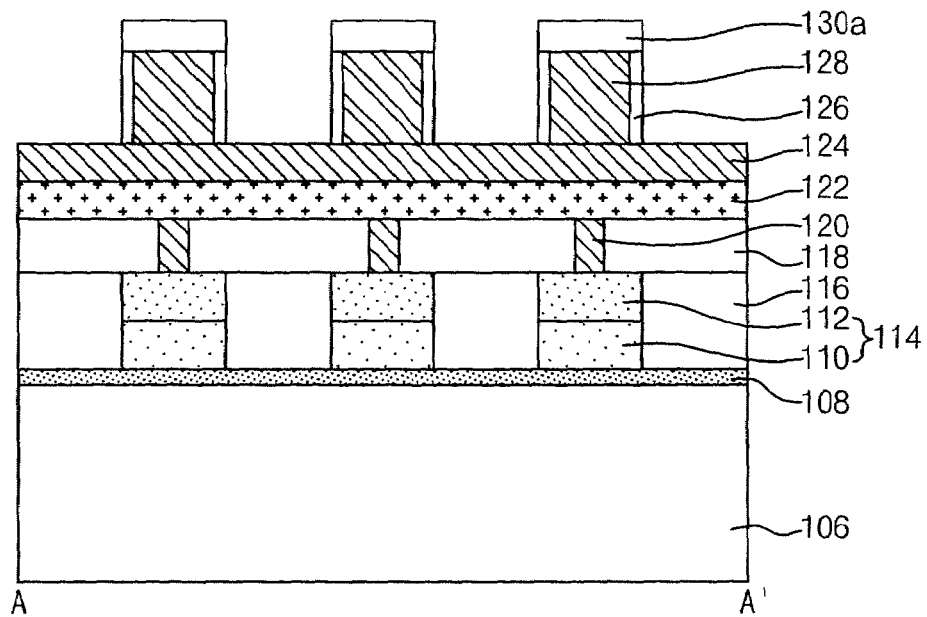
Figure 3E:
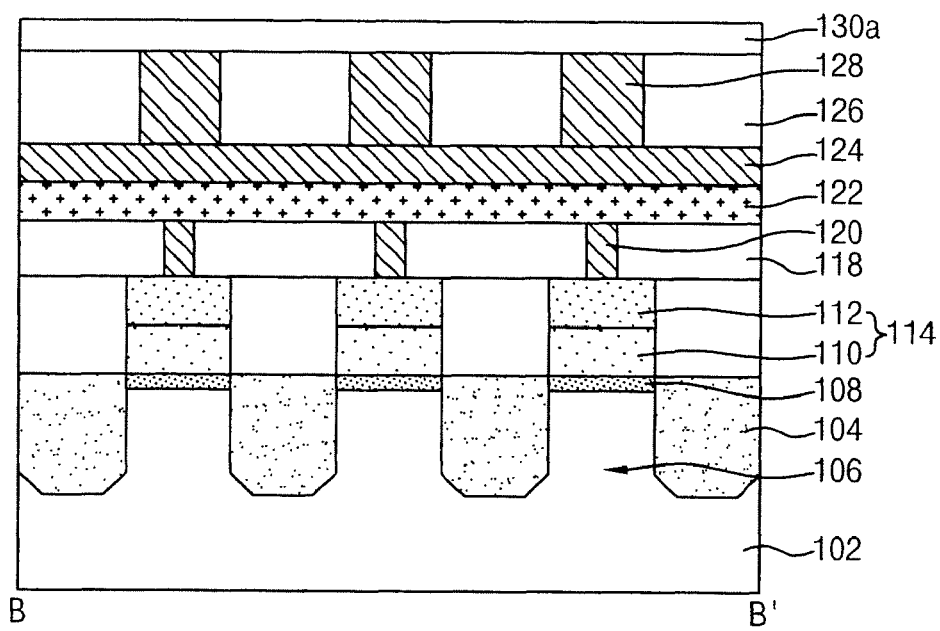

Referring to FIGS. 2E and 3E, hard masks 130a are shown having a greater width than the top electrode contacts 128 and are shown are formed by patterning the hard mask layer 130. The third insulation layer 126 is then etched using the hard masks 130a as an etch mask. Because the hard masks 130a are deliberately designed to have widths greater than those of the top electrode contacts 128, a partial width of the third insulation layer 126 remains on the sidewalls of the top electrode contacts 128 after etching the third insulation layer 126.

Figure 2F:
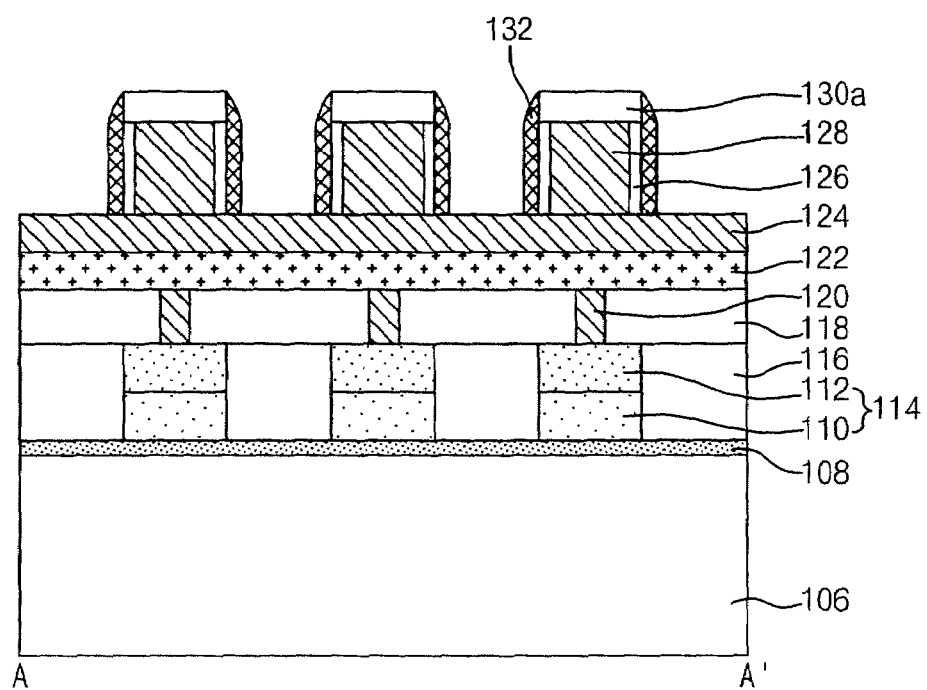
Figure 3F:
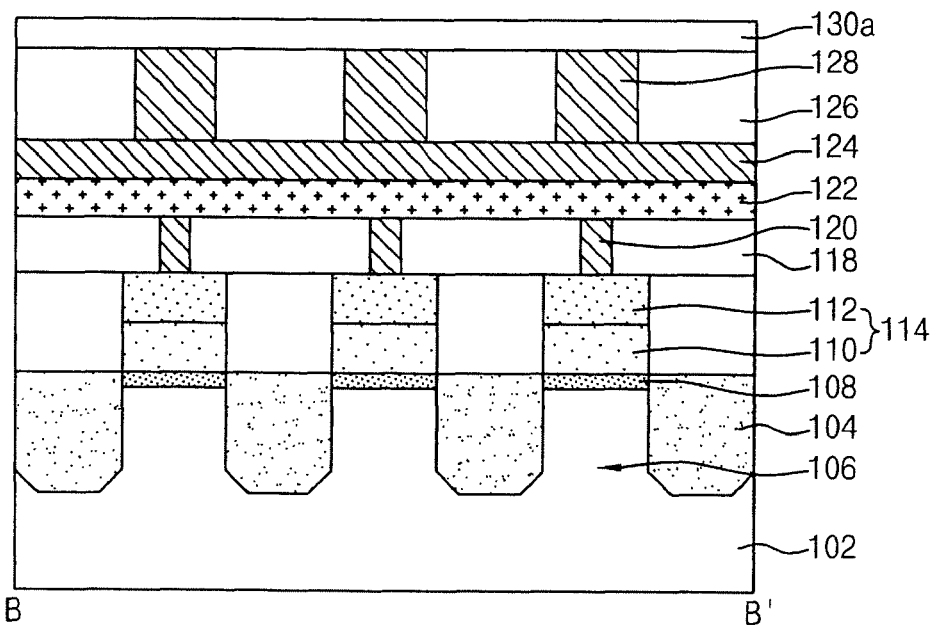

Referring to FIGS. 2F and 3F, spacers 132 are formed on the sidewalls of the hard masks 130a and the remaining portions of the third insulation layer 126.

Figure 2G:
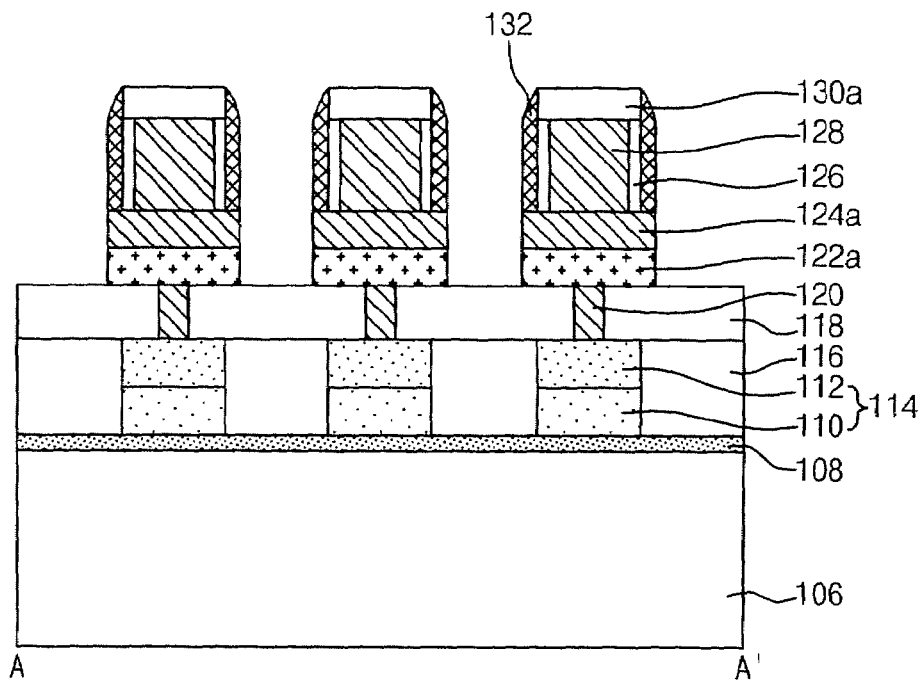
Figure 3G:
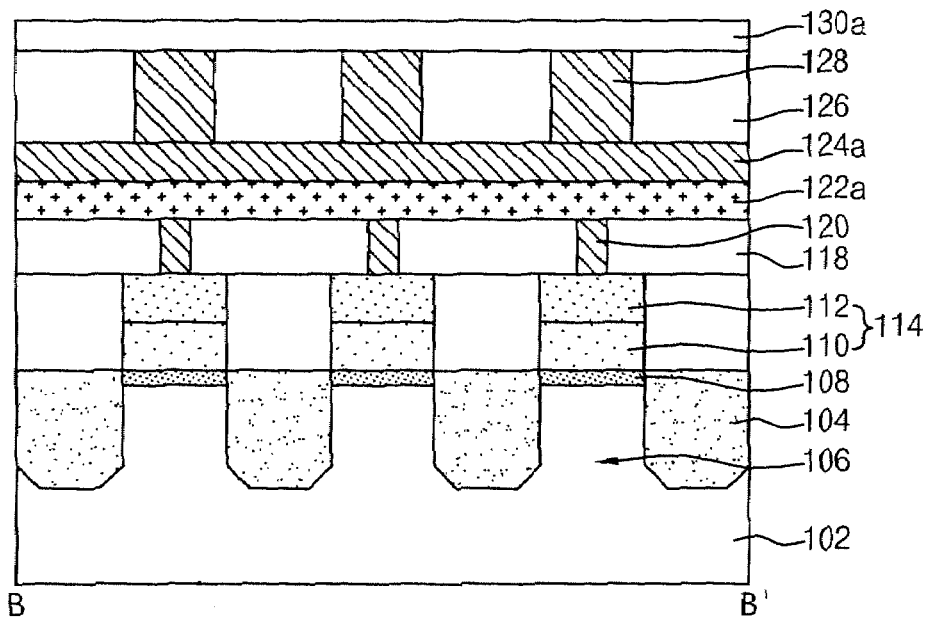

Referring to FIGS. 2G and 3G, stack patterns of a phase change layer 122a and a top electrode 124a are shown formed by etching the first conductive layer 124 for top electrodes and the phase change material layer 122 using the hard masks 130a and the spacers 132 as an etch mask. It is preferred that the stack patterns of the phase change layer 122a and the top electrode 124a be formed substantially along a line.

Figure 2H:
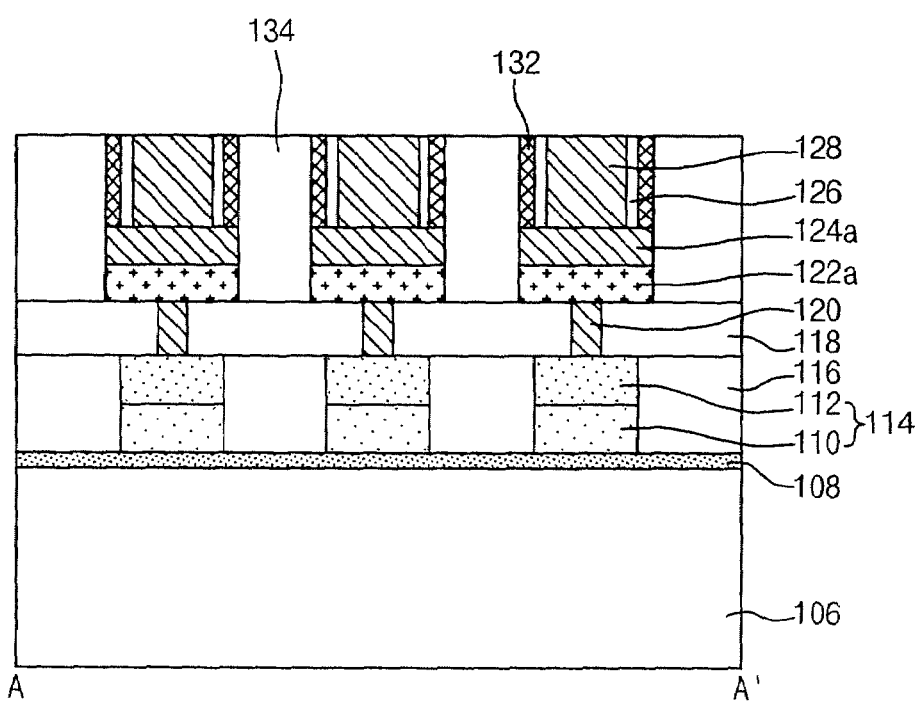
Figure 3H:
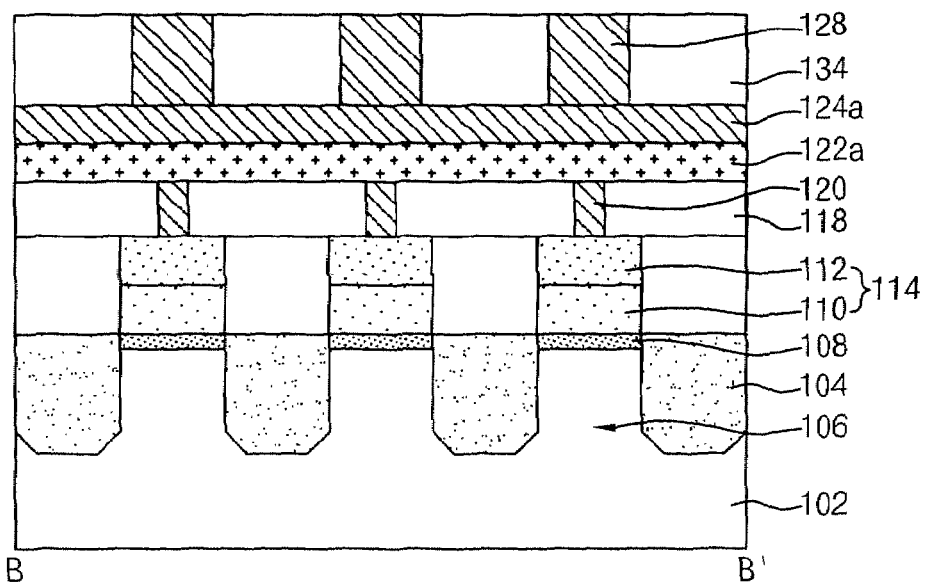

Referring to FIGS. 2H and 3H, a fourth insulation layer 134 is formed on the second insulation layer 118 including the hard masks 130a formed with the spacers 132 on both sidewalls thereof and the stack patterns of the phase change layer 122a and the top electrode 124a, to cover the hard masks 130a. Portions of the fourth insulation layer 134, the hard masks 130a and portions of the spacers 132 are removed through an etch-back and/or CMP process to expose the top electrode contacts 128.

While not shown in the drawings, before forming the fourth insulation layer 134, a protective layer (not shown) can be formed along the profile of the hard masks 130a, the spacers 132 and the stack patterns of the phase change layer 122a and the top electrode 124a. The protective layer (not shown) functions to prevent or minimize any adverse affects of the Joule's heat transferred to the phase change layer 122a from the bottom electrodes 120 from being dissipated to the outside and to thereby decrease the programming current of a completely manufactured phase change memory device.

Figure 2I:
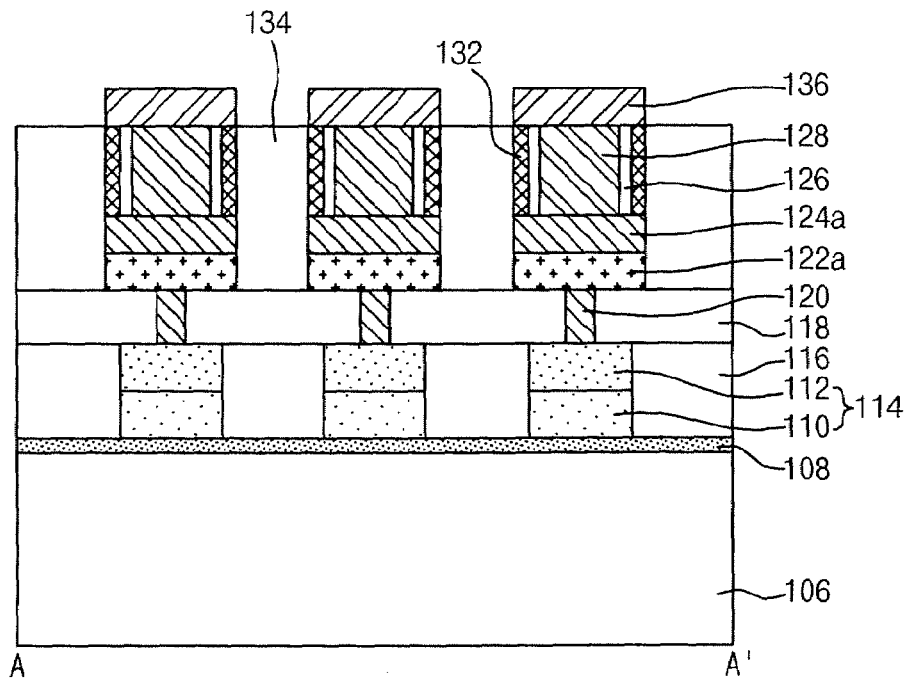
Figure 3I:
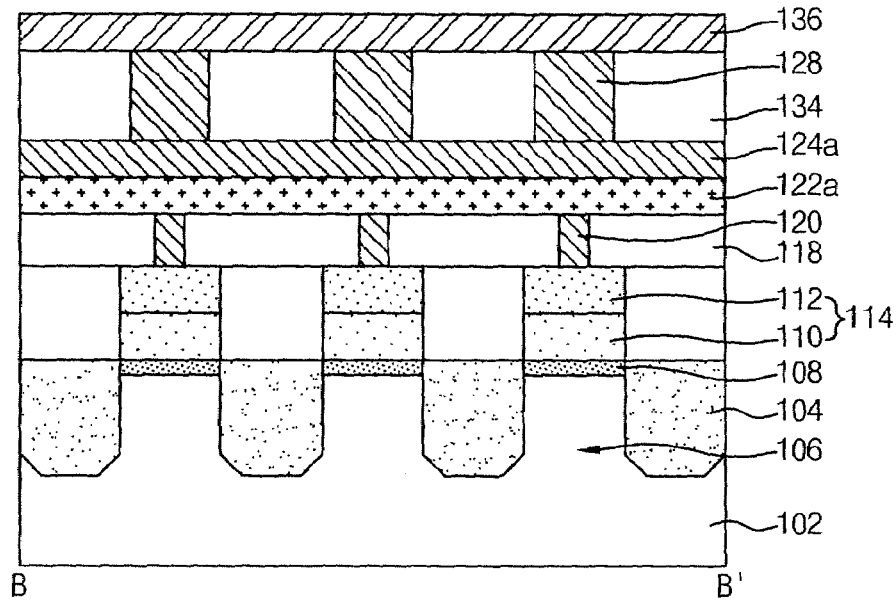

Referring to FIGS. 2I and 3I, a third conductive layer (not shown) for bit lines 136 is formed on the fourth insulation layer 134 including the top electrode contacts 128. By etching the third conductive layer (not shown), bit lines 136 are formed from the third conductive layer (not shown) on the fourth insulation layer 134 to be connected with the top electrode contacts 128. The bit lines 136 are preferably formed to extend along substantially the same direction as the stack patterns of the phase change layer 122a and the top electrode 124a.

Figure 2J:
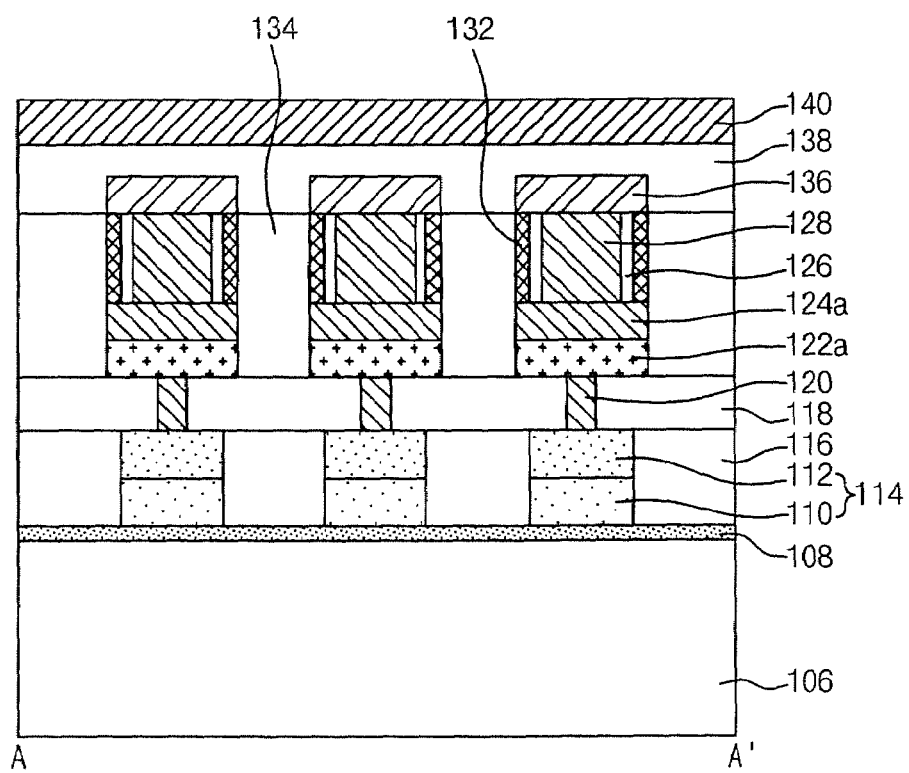
Figure 3J:
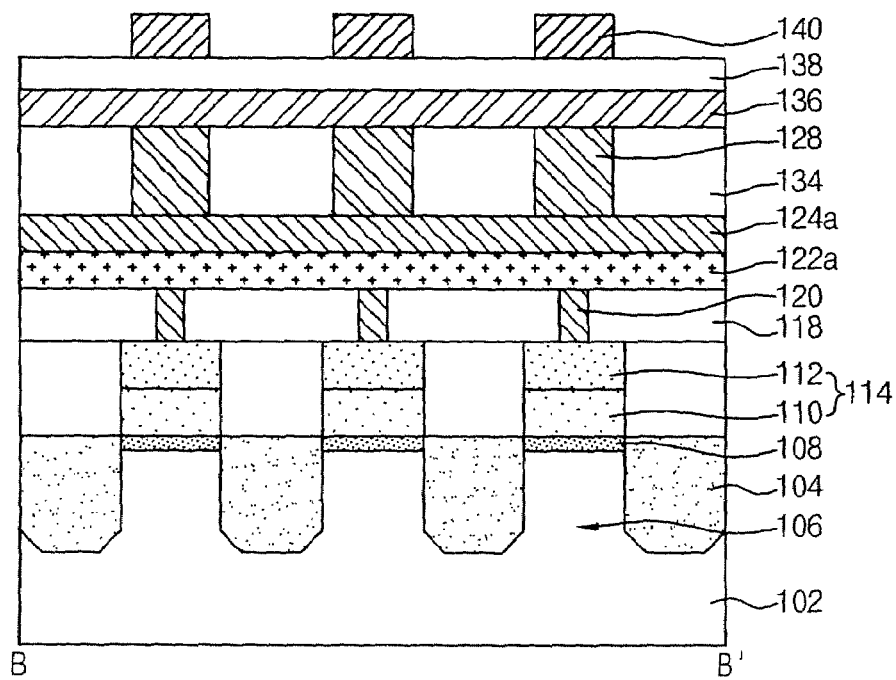

Referring to FIGS. 2J and 3J, a fifth insulation layer 138 is shown formed on the fourth insulation layer 134 which also covers the bit lines 136. Word lines 140 are shown formed on the fifth insulation layer 138. The word lines 140 are preferably formed to align in a direction substantially perpendicular to the bit lines 136. The word lines 140 are also formed to contact the semiconductor substrate 102 although not shown in detail.

As is apparent from the above description, in the present invention, before forming the stack patterns of a phase change layer and a top electrode, top electrode contacts are first formed. Then, the stack patterns of the phase change layer and the top electrode are formed. According to this, in the present invention, it is possible to prevent or at least minimize any adverse affects of having inadequate overlap that may occur between the top electrode contacts and top electrodes during the fabrication process of forming the top electrode contacts. As a result of implementing this fabrication scheme, unwanted composition changes and the etch losses of the phase change layer can be avoided or at least minimized. As a result of implementing this present invention, it is possible to prevent or at least minimize undesirable non-uniform performance characteristics of the phase change layer in these memory devices.

Also, in the present invention, because it is possible to prevent or at least minimize non-uniform performance characteristics of non-uniform phase change layers, the top electrode contacts need not be designed to have an increased size as in the conventional art. Hence, it is possible to prevent or at least minimize current flowing from bit lines to switching elements from changing due to the increase in the contact resistance between the top electrodes and the bit lines. Further, it is possible to prevent or at least minimize the occurrence of bit lines being electrically open from the top electrodes due to the formation of non-uniform contacts.

Further with regards to some of the advantages realized by the present invention, since spacers are formed on both sidewalls of the top electrode contacts, they are used as an etch mask. These spacers are used as etch mask when forming the stack patterns of the phase change layer and the top electrode, a second conductive layer for top electrodes and a phase change material layer. As a result all of these components can be etched more easily when compared to the conventional art. Thereby stable operations of phase change memory devices fabricated from the present invention can be ensured.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a phase change memory device, comprising the steps of:
    forming a phase change material layer and a conductive layer on a semiconductor substrate;
    forming an insulation layer having contact holes on the conductive layer;
    forming top electrode contacts in the contact holes;
    forming hard masks covering the top electrode contacts and covering portions of the insulation layer which adjoin the top electrode contacts;
    etching portions of the insulation layer which are exposed from the hard masks;
    forming spacers on both sidewalls of remaining portions of the insulation layer and the hard masks; and
    etching portions of the conductive layer and portions of the phase change material layer using the spacers and the hard masks as etch masks to form top electrodes and phase change layer zones underneath the formed top electrodes.

2. The method according to claim 1, wherein, before the step of forming the phase change material layer and the conductive layer, the method further comprises the steps of:
    forming switching elements on the semiconductor substrate; and
    forming bottom electrodes to contact the switching elements.

3. The method according to claim 2, wherein the switching elements are vertical PN diodes switching elements.

4. The method according to claim 2, wherein, before the step of forming the switching elements, the method further comprises the step of:
    forming impurity regions in a surface of the semiconductor substrate.

5. The method according to claim 2, wherein the bottom electrodes are formed as any one of TiAlN, TiW, TiN, WN and admixtures thereof.

6. The method according to claim 1, wherein the conductive layer comprises any one of TiAlN, TiW, TiN, WN and admixtures thereof.

7. The method according to claim 1, wherein the step of forming the top electrode contacts comprises the steps of:
  depositing another conductive layer for top electrode contacts on the insulation layer including the contact holes; and
  removing portions of the another conductive layer for top electrode contacts until the insulation layer is exposed.

8. The method according to claim 7, wherein the step of removing portions of the another conductive layer for top electrode contacts is performed using an etch-back or a CMP process.

9. The method according to claim 1, wherein the step of etching the portions of the insulation layer which are exposed from the hard masks is implemented such that portions of the insulation layer remain on sidewalls of the top electrode contacts.

10. The method according to claim 1, wherein the insulation layer, the conductive layer and the phase change material layer are etched substantially along a linear alignment.

11. The method according to claim 1, wherein, after the step of forming the top electrodes and the phase change layer zones, the method further comprises the step of: forming a protective layer along a profile of the phase change layer, the top electrodes, the hard masks and the spacers.

12. The method according to claim 11, wherein, after the step of removing the hard masks, the method further comprises the step of:
  forming bit lines on the top electrode contacts contacting the top electrode contacts.

13. The method according to claim 12, wherein, after the step of forming the bit lines, the method further comprises the step of:
  forming word lines over the bit lines to contact the semiconductor substrate.

14. The method according to claim 1, wherein, after the step of forming the top electrodes and the phase change layer zones, the method further comprises the step of:
  removing the hard masks from the top electrode contacts.

* * * * *